(12) United States Patent
Kimura et al.

(10) Patent No.: US 10,290,491 B2
(45) Date of Patent: May 14, 2019

(54) SUBSTRATE TREATMENT APPARATUS AND SUBSTRATE TREATMENT METHOD

(71) Applicant: TOSHIBA MEMORY CORPORATION, Minato-Ku (JP)

(72) Inventors: Shinsuke Kimura, Yokkaichi (JP); Tatsuhiko Koide, Kuwana (JP); Yoshihiro Ogawa, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/670,349

(22) Filed: Aug. 7, 2017

(65) Prior Publication Data

US 2017/0338102 A1    Nov. 23, 2017

Related U.S. Application Data

(62) Division of application No. 14/836,145, filed on Aug. 26, 2015, now Pat. No. 9,748,091.

(30) Foreign Application Priority Data

Apr. 1, 2015  (JP) .................. 2015-075015

(51) Int. Cl.
  *H01L 21/02*   (2006.01)
  *H01L 21/306*  (2006.01)
  *H01L 21/67*   (2006.01)

(52) U.S. Cl.
  CPC .. *H01L 21/02057* (2013.01); *H01L 21/30604* (2013.01); *H01L 21/67028* (2013.01); *H01L 21/67109* (2013.01)

(58) Field of Classification Search
  USPC .......... 118/715, 724, 52, 612, 56, 50.1, 666, 118/667, 69
  See application file for complete search history.

(56) References Cited

U.S. PATENT DOCUMENTS

| | | | |
|---|---|---|---|
| 8,821,974 B2 | 9/2014 | Kimura et al. | |
| 9,695,513 B2 | 7/2017 | Ueda | |
| 2004/0212114 A1* | 10/2004 | Kashiwagi | C23C 16/401 264/30 |
| 2004/0253826 A1 | 12/2004 | Ivanov | |
| 2011/0054184 A1 | 3/2011 | Yoshida | |
| 2012/0064727 A1* | 3/2012 | Oh | H01L 21/02057 438/745 |

(Continued)

FOREIGN PATENT DOCUMENTS

| | | |
|---|---|---|
| JP | 2012-44144 A | 3/2012 |
| JP | 2014-143340 | 8/2014 |

(Continued)

*Primary Examiner* — Yewebdar T Tadesse
(74) *Attorney, Agent, or Firm* — Oblon, McClelland, Maier & Neustadt. L.L.P.

(57) ABSTRACT

In one embodiment, a substrate treatment apparatus includes a housing configured to house a substrate. The apparatus further includes a chemical supplying module configured to supply one or more chemicals in a gas state to the substrate in the housing, the one or more chemicals including a first chemical that contains a silylation agent. The apparatus further includes a cooling module configured to cool the substrate in the housing while any of the one or more chemicals is supplied to the substrate in the housing.

9 Claims, 13 Drawing Sheets

(56) References Cited

U.S. PATENT DOCUMENTS

| | | |
|---|---|---|
| 2014/0065295 A1 | 3/2014 | Emoto et al. |
| 2014/0213064 A1 | 7/2014 | Koide et al. |
| 2014/0261570 A1 | 9/2014 | Orii et al. |
| 2015/0072536 A1* | 3/2015 | Muramatsu ............... G03F 7/40 |
| | | 438/781 |

FOREIGN PATENT DOCUMENTS

| | | |
|---|---|---|
| JP | 2014-170806 A | 9/2014 |
| JP | 2014-197571 | 10/2014 |
| JP | 2014-199917 | 10/2014 |

* cited by examiner

| COOLANT LIQUID | BOILING POINT |
|---|---|
| IPA | 82°C |
| METHANOL | 64.51°C |
| ETHANOL | 78.3°C |
| METHYL ETHYL KETONE | 79.6°C |
| DIISOPROPYL ETHER | 69°C |
| DIETHYL ETHER | 35°C |
| TETRAHYDROFURAN | 66°C |
| n-PENTANE | 36.1°C |

FIG. 9

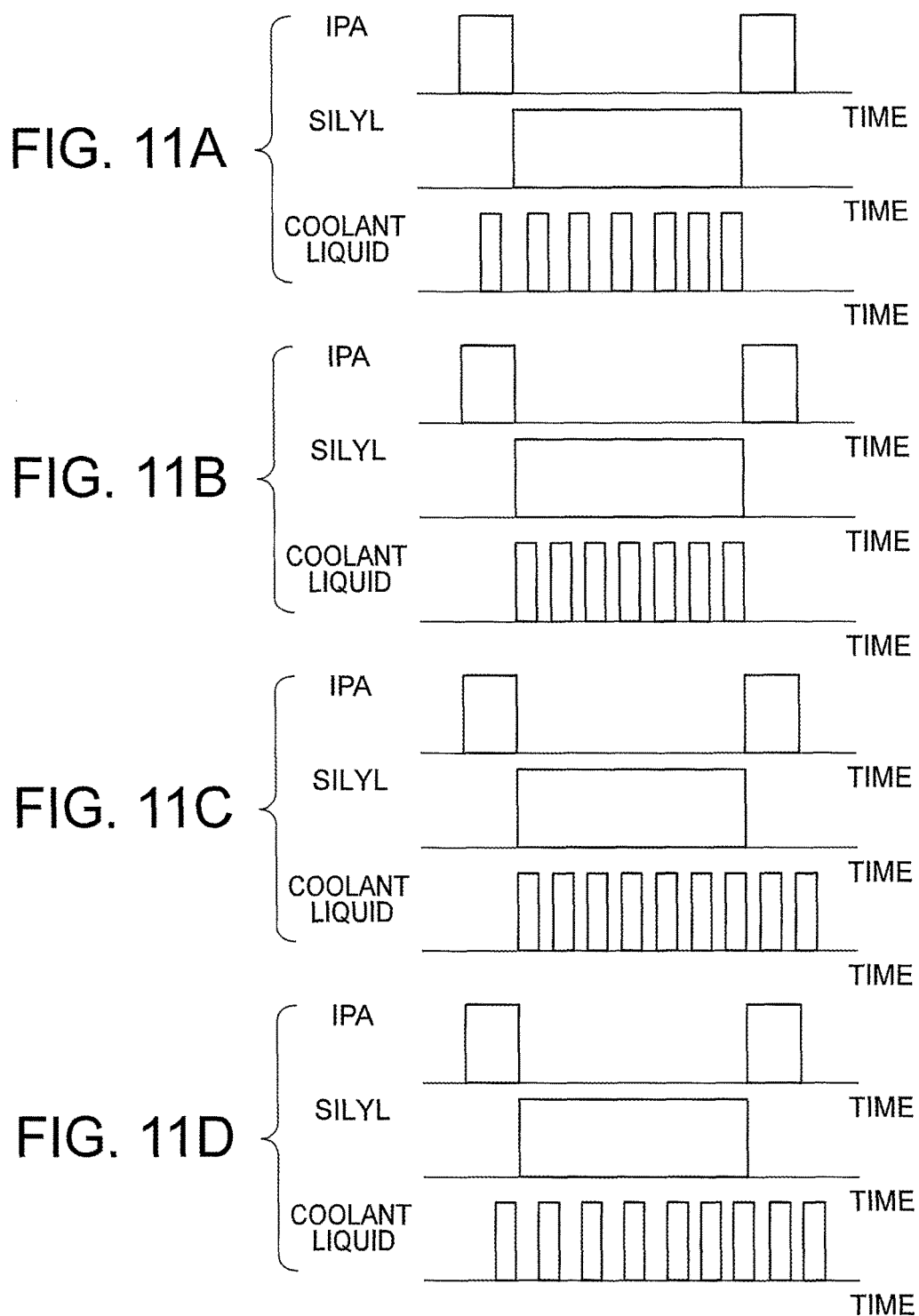

SUBSTRATE TREATMENT APPARATUS AND SUBSTRATE TREATMENT METHOD

CROSS REFERENCE TO RELATED APPLICATION

This application is a divisional of U.S. application Ser. No. 14/836,145, filed Aug. 26, 2015 which is based upon and claims the benefit of priority from the prior Japanese Patent Application No. 2015-75015, filed on Apr. 1, 2015, the entire contents of which are incorporated herein by reference.

FIELD

Embodiments described herein relate to a substrate treatment apparatus and a substrate treatment method.

BACKGROUND

When an etching step is performed to form a fine pattern having a high aspect ratio on a semiconductor wafer, a cleaning step and a drying step are then performed to remove an impurity and a residue left on a surface of the semiconductor wafer. It is possible to suppress, by silylating a surface of the pattern in this cleaning step, collapse of the pattern in the drying step. In this case, the collapse margin can be widened by rinsing the semiconductor wafer with isopropyl alcohol (IPA) after the silylation and then spin-drying the semiconductor wafer. In many cases, the semiconductor wafer is also rinsed with the IPA before the silylation.

On the other hand, it is studied to silylate the semiconductor wafer in a batch treatment apparatus instead of a single-wafer treatment apparatus. However, if the silylation agent and the IPA are used in a liquid state in the batch treatment apparatus, amounts of using these chemicals are extremely large. Therefore, it is considered to reduce the amounts of using these chemicals by using the silylation agent and the IPA in a gas state (vapor state). In this case, the silylation agent and the IPA are liquefied on the surface of the semiconductor wafer to be attached to the semiconductor wafer, so that the semiconductor wafer can be wet. However, the silylation agent and the IPA attached to the semiconductor wafer are vaporized during the silylation, and therefore the semiconductor wafer is dried during the silylation. Accordingly, the pattern on the semiconductor wafer may collapse.

BRIEF DESCRIPTION OF THE DRAWINGS

FIG. 9 is a table illustrating examples of a coolant liquid of the fourth embodiment;

FIGS. 10A to 12C are graphs illustrating examples of operation of the substrate treatment apparatus of the fourth embodiment.

DETAILED DESCRIPTION

Embodiments will now be explained with reference to the accompanying drawings.

In one embodiment, a substrate treatment apparatus includes a housing configured to house a substrate. The apparatus further includes a chemical supplying module configured to supply one or more chemicals in a gas state to the substrate in the housing, the one or more chemicals including a first chemical that contains a silylation agent. The apparatus further includes a cooling module configured to cool the substrate in the housing while any of the one or more chemicals is supplied to the substrate in the housing.

First Embodiment

Figure 1A:
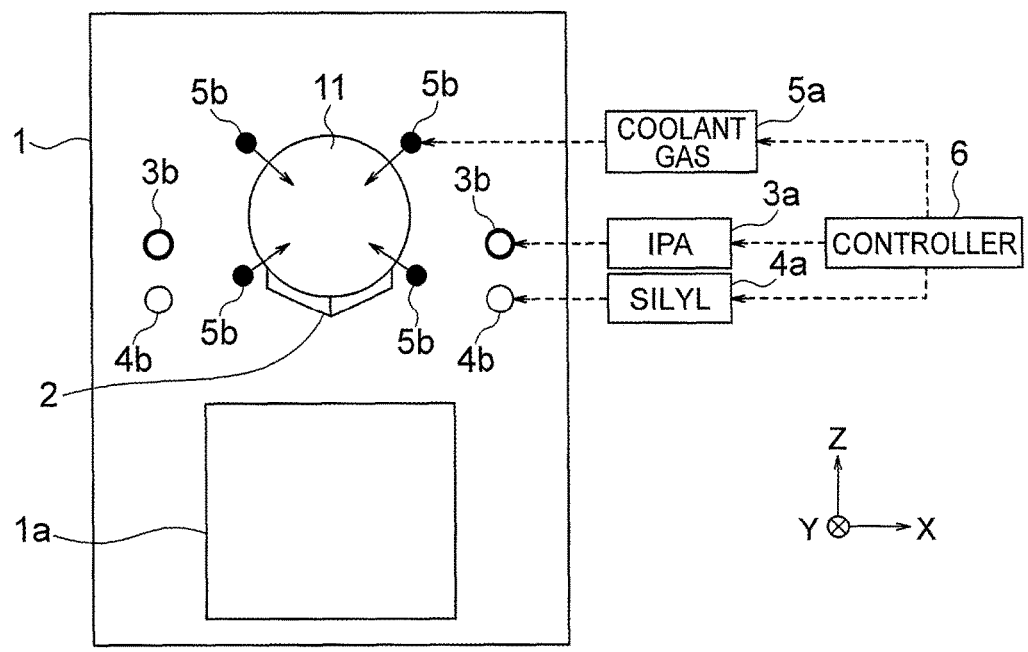
FIGS. 1A and 1B are sectional views illustrating a structure of a substrate treatment apparatus of a first embodiment.
Figure 1B:
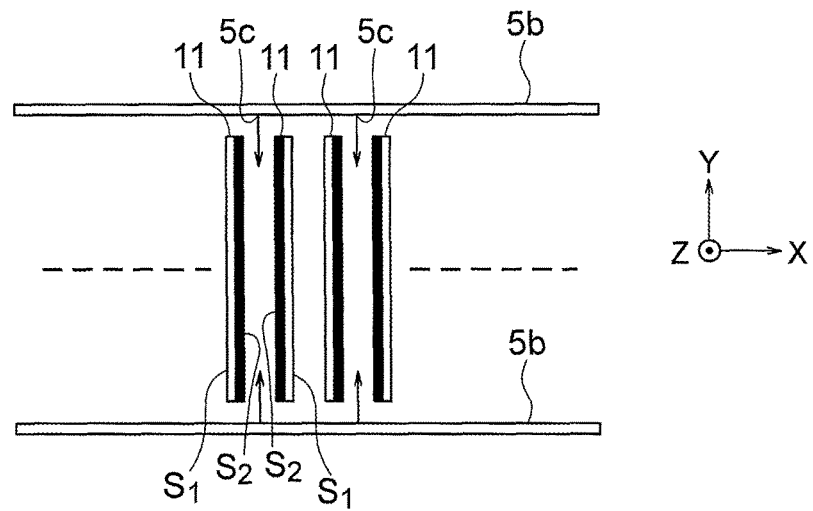

FIGS. 1A and 1B are sectional views illustrating a structure of a substrate treatment apparatus of a first embodiment. FIG. 1A illustrates a vertical cross section of the substrate treatment apparatus. FIG. 1B illustrates a horizontal cross section of the substrate treatment apparatus.

As illustrated in FIGS. 1A and 1B, the substrate treatment apparatus of the present embodiment includes a chamber 1, a wafer holder 2, an IPA supplying module 3a, IPA pipes 3b, a silylation agent supplying module 4a, silylation agent pipes 4b, a coolant gas supplying module 5a, coolant gas pipes 5b, coolant gas supplying ports 5c and a controller 6. The chamber 1 is an example of a housing. The IPA supplying module 3a, the IPA pipes 3b, the silylation agent supplying module 4a and the silylation agent pipes 4b are an example of a chemical supplying module. The coolant gas supplying module 5a, the coolant gas pipes 5b and the coolant gas supplying ports 5c are an example of a cooling module.

The substrate treatment apparatus of the present embodiment is a batch treatment apparatus simultaneously treating plural semiconductor wafers 11. The semiconductor wafers 11 are an example of a substrate. A reference sign $S_1$ in FIG. 1B illustrates a front surface of each semiconductor wafer 11. A reference sign $S_2$ in FIG. 1B illustrates a back surface of each semiconductor wafer 11.

FIGS. 1A and 1B illustrate X and Y directions parallel with an installation surface of the substrate treatment apparatus and perpendicular to each other, and a Z direction perpendicular to the installation surface of the substrate treatment apparatus. In the specification, a +Z direction is handled as an upward direction and a −Z direction is handled as a downward direction. For example, a positional relation between the semiconductor wafers 11 and the coolant gas pipes 5b is expressed that the coolant gas pipes 5b are located above and below the semiconductor wafers 11. The −Z direction of the present embodiment may be or may not be the same as the gravity direction.

Hereinafter, the structure of the substrate treatment apparatus of the present embodiment will be described in detail.

The chamber 1 is used to house the plural semiconductor wafers 11. The wafer holder 2 can hold these semiconductor wafers 11. The wafer holder 2 holds the semiconductor wafers 11 such that the front surfaces $S_1$ of the semiconductor wafers 11 face each other and the back surfaces $S_2$ of the semiconductor wafers 11 face each other. In addition, the wafer holder 2 holds the semiconductor wafers 11 such that the front surfaces $S_1$ and the back surfaces $S_2$ of the semiconductor wafers 11 are in parallel to the Z direction. The chamber 1 of the present embodiment includes a treatment tank 1a for rinsing the semiconductor wafers 11 with pure water below the wafer holder 2.

The IPA supplying module 3a supplies IPA in a gas state (vapor state) to the semiconductor wafers 11 in the chamber 1. The IPA supplying module 3a supplies the IPA into the chamber 1 through the IPA pipes 3b. The IPA is supplied to the front surfaces $S_1$ of the semiconductor wafers 11 to be used for rinsing the front surfaces $S_1$ of the semiconductor wafers 11. The IPA has a boiling point of 82° C. The IPA is an example of one or more chemicals and an example of a second chemical that contains alcohol.

The silylation agent supplying module 4a supplies a silylation agent in a gas state (vapor state) to the semiconductor wafers 11 in the chamber 1. The silylation agent supplying module 4a supplies the silylation agent into the chamber 1 through the silylation agent pipes 4b. The silylation agent is supplied to the front surfaces $S_1$ of the semiconductor wafers 11 to be used for silylating the front surfaces $S_1$ of the semiconductor wafers 11. Examples of the silylation agent include trimethylsilyl dimethylamine (TMS-DMA) and hexamethyldisilazane (HMDS). The TMSDMA and the HMDS have boiling points of 86° C. and 126° C., respectively. Both of the boiling points are higher than that of the IPA. The TMSDMA and the HMDS are examples of the one or more chemicals and examples of a first chemical that contains a silylation agent.

The coolant gas supplying module 5a supplies a coolant gas to the semiconductor wafers 11 in the chamber 1. The coolant gas supplying module 5a jets the coolant gas to the back surfaces $S_2$ of the semiconductor wafers 11 from the coolant gas supplying ports 5c of the coolant gas pipes 5b. The semiconductor wafers 11 are thereby cooled. The coolant gas of the present embodiment is supplied to the back surfaces $S_2$ of the semiconductor wafers 11 so as not to inhibit the front surfaces $S_1$ of the semiconductor wafers 11 from being silylated or rinsed. An example of the coolant gas is an inert gas such as a nitrogen ($N_2$) gas, a helium (He) gas or an argon (Ar) gas.

The coolant gas supplying module 5a of the present embodiment supplies the coolant gas to the semiconductor wafers 11 to cool the semiconductor wafers 11 while the silylation agent or the IPA is supplied to the semiconductor wafers 11. The semiconductor wafers 11 during silylation or rinsing can be thereby cooled. Such an operation of the coolant gas supplying module 5a is controlled by the controller 6.

In addition, the coolant gas supplying module 5a of the present embodiment cools the semiconductor wafers 11 such that the temperature of the semiconductor wafers 11 is lower than the boiling points of the silylation agent and the IPA. In the present embodiment, the boiling point of the IPA is lower than that of the silylation agent. Therefore, the semiconductor wafers 11 are cooled to a temperature lower than 82° C. which is the boiling point of the IPA. Such an operation of the coolant gas supplying module 5a is controlled by the controller 6.

The controller 6 controls various operations of the substrate treatment apparatus. The controller 6 controls, for example, supplying timings and supplying amounts of the IPA, the silylation agent and the coolant gas. It is possible to control the supplying timing and the supplying amount of the IPA, for example, by controlling an operation of the IPA supplying module 3a and opening and closing of valves disposed on the IPA pipes 3b. The same applies to the silylation agent and the coolant gas.

Figure 2:
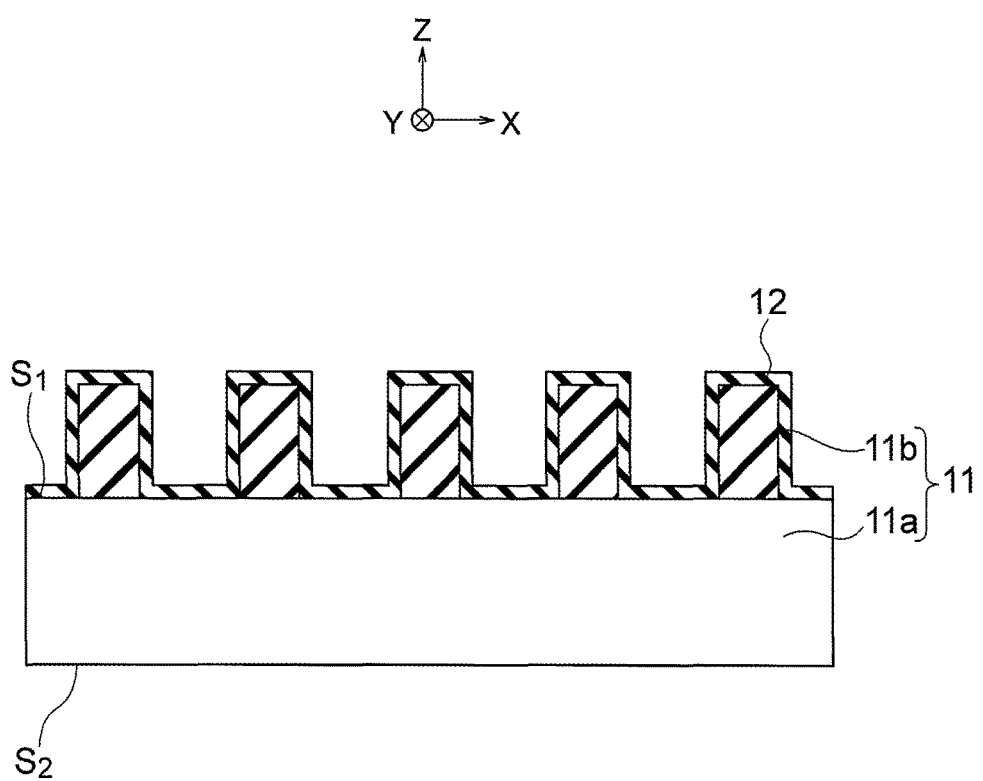
FIG. 2 is a sectional view illustrating an example of a semiconductor wafer of the first embodiment.

FIG. 2 is a sectional view illustrating an example of a semiconductor wafer 11 of the first embodiment.

In FIG. 2, the semiconductor wafer 11 is disposed such that the front surface $S_1$ and the back surface $S_2$ face the +Z direction and the −Z direction, respectively. The semiconductor wafer 11 in FIG. 2 includes a semiconductor substrate 11a and plural patterns 11b formed on the semiconductor substrate 11a. These patterns 11b may be formed directly on the semiconductor substrate 11a or formed on the semiconductor substrate 11a through another layer. These patterns 11b are formed on a side of the front surface $S_1$ of the semiconductor wafer 11. These patterns 11b are formed of a film that contains silicon, such as a silicon film, a silicon oxide film or a silicon nitride film.

In FIG. 2, a silylation film 12 is formed on the front surface $S_1$ of the semiconductor wafer 11, and the patterns 11b are covered with the silylation film 12. The silylation film 12 is formed with the silylation agent supplied from the silylation agent supplying module 4a.

As described above, the substrate treatment apparatus of the present embodiment supplies the silylation agent and the IPA in a gas state to the semiconductor wafers 11. Therefore, according to the present embodiment, it is possible to reduce the amounts of using the silylation agent and the IPA.

In this case, the silylation agent and the IPA are liquefied on the front surfaces $S_1$ of the semiconductor wafers 11 to be attached to the semiconductor wafers 11, so that the semiconductor wafers 11 can be wet. However, the silylation agent and the IPA attached to the semiconductor wafers 11 are vaporized, and therefore the semiconductor wafers 11 are dried. Accordingly, the patterns 11b on the semiconductor wafers 11 may collapse. For example, when the silylation agent having a boiling point higher than the IPA is supplied after the IPA is supplied, the IPA attached to the semiconductor wafers 11 is easily vaporized during the silylation.

Therefore, the substrate treatment apparatus of the present embodiment supplies the coolant gas to the semiconductor wafers 11 to cool the semiconductor wafers 11 while the silylation agent or the IPA is supplied to the semiconductor wafers 11. It is thereby possible to suppress vaporization of the silylation agent or the IPA from the front surfaces $S_1$ of the semiconductor wafers 11. Therefore, according to the present embodiment, it is possible to suppress drying of the semiconductor wafers 11 and collapse of the patterns 11b on the semiconductor wafers 11.

For example, when the silylation agent having a boiling point higher than the IPA is supplied after the IPA is supplied, it is desired to cool the semiconductor wafers 11 during the supply of the silylation agent. It is thereby possible to suppress vaporization of the IPA attached to the semiconductor wafers 11 during the silylation.

In addition, the substrate treatment apparatus of the present embodiment cools the semiconductor wafers 11 such that the temperature of the semiconductor wafers 11 is lower than the boiling points of the silylation agent and the IPA. Therefore, according to the present embodiment, it is possible to restrain the temperatures of the liquefied silylation agent and the IPA from becoming higher than the boiling points thereof, and it is possible to suppress vaporization of the silylation agent and the IPA effectively.

At this time, the substrate treatment apparatus of the present embodiment preferably cools the semiconductor wafers 11 to a temperature at which a large amount of water droplets is not generated due to condensation on the front surfaces $S_1$ of the semiconductor wafers 11. For example, it is possible to suppress such condensation by setting the temperature of the semiconductor wafers 11 at 15° C. or higher.

FIGS. 3A to 4C are graphs illustrating examples of operation of the substrate treatment apparatus of the first embodiment.

Figure 3A:
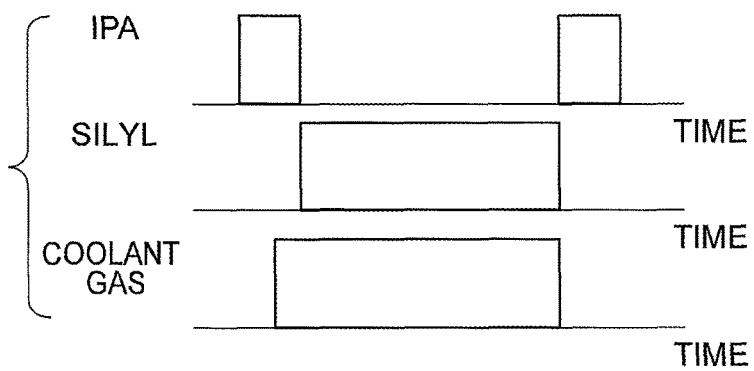
FIGS. 3A to 4C are graphs illustrating examples of operation of the substrate treatment apparatus of the first embodiment.

FIG. 3A illustrates the supplying timing of the IPA, the silylation agent, and the coolant gas. In FIG. 3A, the IPA is supplied to the semiconductor wafers 11 before the silylation agent is supplied, and the IPA is supplied again to the semiconductor wafers 11 after the silylation agent is supplied. The same applies to FIGS. 3B to 4C described later. The silylation agent is, for example, TMSDMA or HMDS. The silylation agent is an example of a chemical having a first boiling point. The IPA is an example of a chemical having a second boiling point lower than the first boiling point.

In an example of FIG. 3A, supply of the coolant gas is started before start of supply of the silylation agent, and is stopped at the same time as stop of the supply of the silylation agent. Therefore, the supply of the coolant gas is started during the supply of the IPA. This example has an advantage that the semiconductor wafers 11 can be sufficiently cooled because the semiconductor wafers 11 can be cooled before the silylation.

Figure 3B:
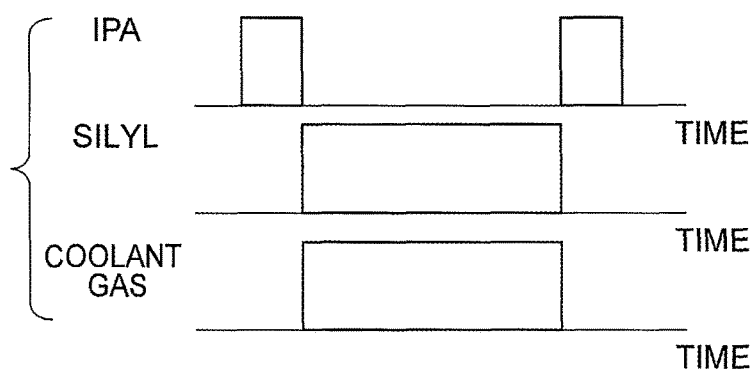

In an example of FIG. 3B, the supply of the coolant gas is started at the same time as the start of the supply of the silylation agent, and is stopped at the same time as the stop of the supply of the silylation agent. This example has an advantage that an amount of using the coolant gas can be reduced because a period for cooling the semiconductor wafers 11 can be limited only to the period in which the silylation is performed.

Figure 3C:
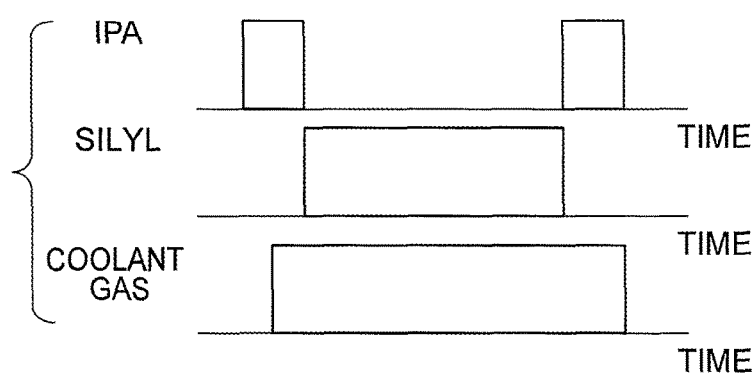

In an example of FIG. 3C, the supply of the coolant gas is started before the start of the supply of the silylation agent, and is stopped after the stop of the supply of the silylation agent. Therefore, the supply of the coolant gas is started during the supply of the IPA, and is stopped during the supply of the IPA or after stop of the supply of the IPA. This example has an advantage that the semiconductor wafer 11 can be surely cooled until the silylation is completed.

Figure 3D:
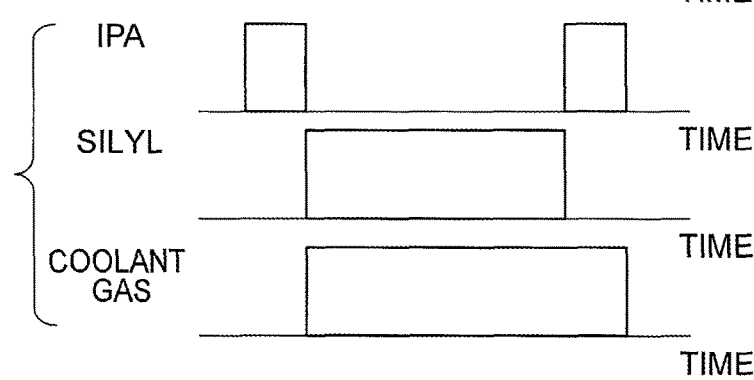

In an example of FIG. 3D, the supply of the coolant gas is started at the same time as the start of the supply of the silylation agent, and is stopped after the stop of the supply of the silylation agent. Therefore, the supply of the coolant gas is stopped during the supply of the IPA or after the stop of the supply of the IPA. This example has an advantage that the semiconductor wafers 11 can be surely cooled until the silylation is completed.

In FIGS. 3A to 3D, the coolant gas is supplied to the semiconductor wafers 11 in the whole period in which the silylation agent is supplied to the semiconductor wafers 11. On the other hand, in FIGS. 4A to 4C, the coolant gas is supplied to the semiconductor wafers 11 in a part of a period in which the silylation agent is supplied to the semiconductor wafers 11.

Figure 4A:
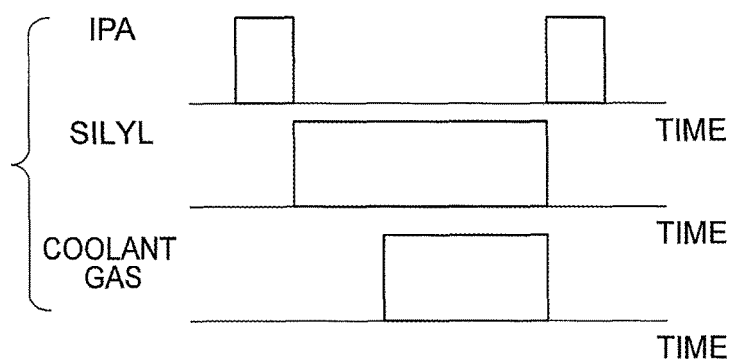
Figure 4B:
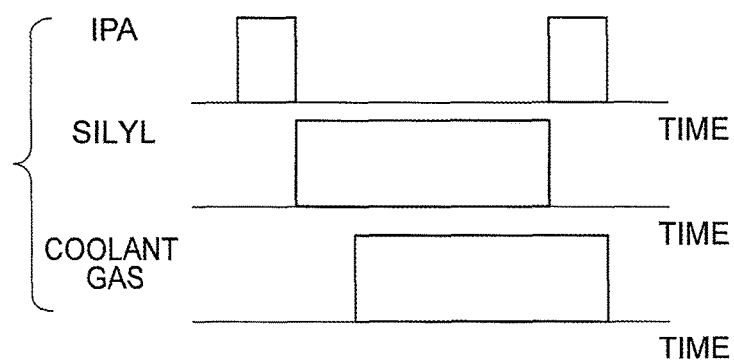
Figure 4C:
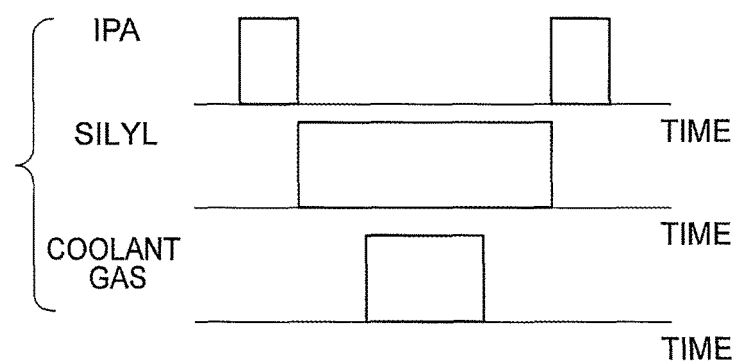

In an example of FIG. 4A, the supply of the coolant gas is started during the supply of the silylation agent, and is stopped at the same time as the stop of the supply of the silylation agent. In an example of FIG. 4B, the supply of the coolant gas is started during the supply of the silylation agent, and is stopped after the stop of the supply of the silylation agent. In an example of FIG. 4C, the supply of the coolant gas is started during the supply of the silylation agent, and is stopped during the supply of the silylation agent. These examples have an advantage that the amount of using the coolant gas can be reduced more than in the examples of FIGS. 3A to 3D.

Figure 5:
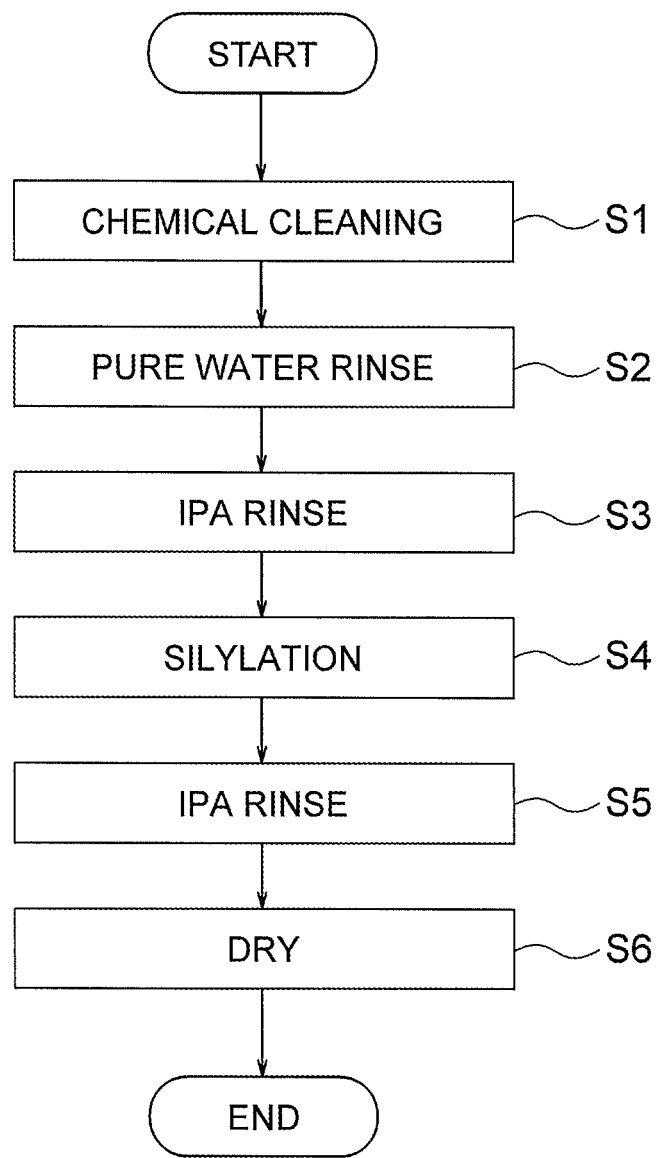
FIG. 5 is a flowchart illustrating a substrate treatment method of the first embodiment.

FIG. 5 is a flowchart illustrating a substrate treatment method of the first embodiment.

First, the plural semiconductor wafers 11 to be treated is cleaned with a liquid chemical outside the substrate treatment apparatus of the present embodiment (step S1). Next, these semiconductor wafers 11 are rinsed with pure water outside the substrate treatment apparatus of the present embodiment (step S2).

Next, these semiconductor wafers 11 are carried into the substrate treatment apparatus to perform processing of steps S3 to S6. First, the IPA supplying module 3a rinses the semiconductor wafers 11 with the IPA in a gas state (step S3). Next, the silylation agent supplying module 4a silylates the semiconductor wafers 11 with the silylation agent in a gas state (step S4). Next, the IPA supplying module 3a rinses the semiconductor wafers 11 again with the IPA in a gas state (step S5). The coolant gas supplying module 5a supplies the coolant gas to the semiconductor wafers 11 to cool the semiconductor wafers 11 while processing of at least one of the steps S3 to S5 is performed. Next, the semiconductor wafers 11 are dried by using inert gas such as $N_2$ gas (step S6). In this way, the silylation of the semiconductor wafers 11 is completed.

In the flow of FIG. 5, after the semiconductor wafers 11 are carried into the substrate treatment apparatus, the semiconductor wafers 11 may be rinsed with pure water in the treatment tank 1a in the substrate treatment apparatus before step S3. In this case, the processing of step S2 may be or may not be omitted. In the latter case, the semiconductor wafers 11 are rinsed with pure water both outside and inside the substrate treatment apparatus.

As described above, the coolant gas in the present embodiment is supplied to the semiconductor wafers 11 to cool the semiconductor wafers 11 while the silylation agent or the IPA in a gas state is supplied to the semiconductor wafers 11. Therefore, according to the present embodiment, it is possible to suppress collapse of the patterns 11b on the semiconductor wafers 11 when the patterns 11b on the semiconductor wafers 11 are silylated using a chemical in a gas state.

It is effective to apply the present embodiment to a batch treatment apparatus that processes the plural semiconductor wafers 11 simultaneously. However, the present embodiment may be applied to a single-wafer treatment apparatus that processes the plural semiconductor wafers 11 individually.

Second Embodiment

Figure 6A:
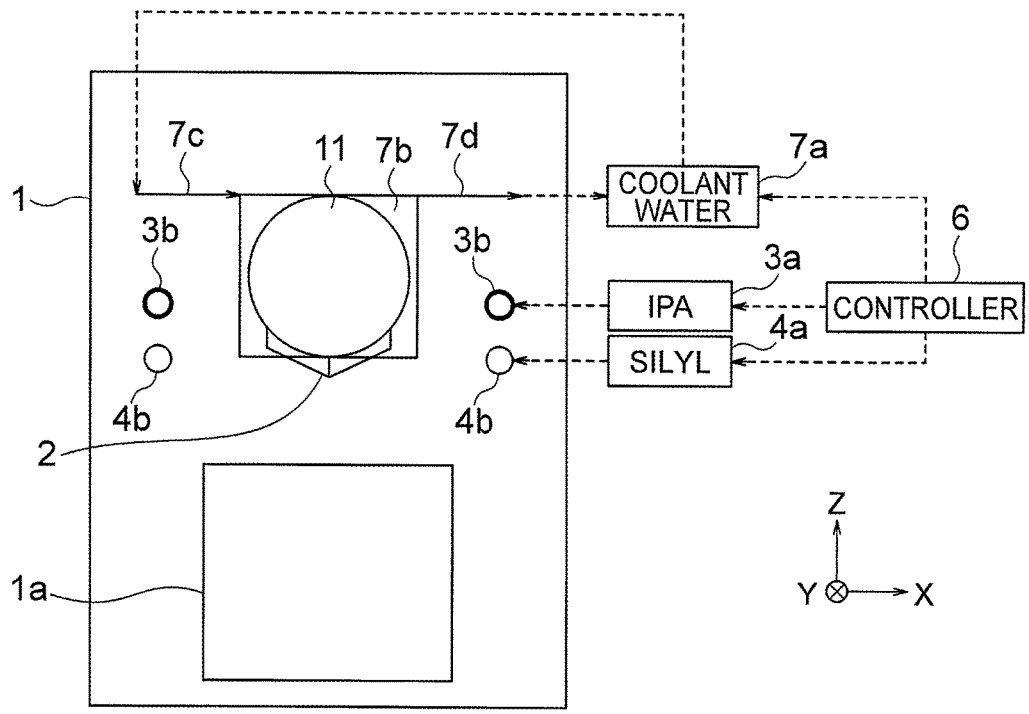
FIGS. 6A and 6B are sectional views illustrating a structure of a substrate treatment apparatus of a second embodiment.
Figure 6B:
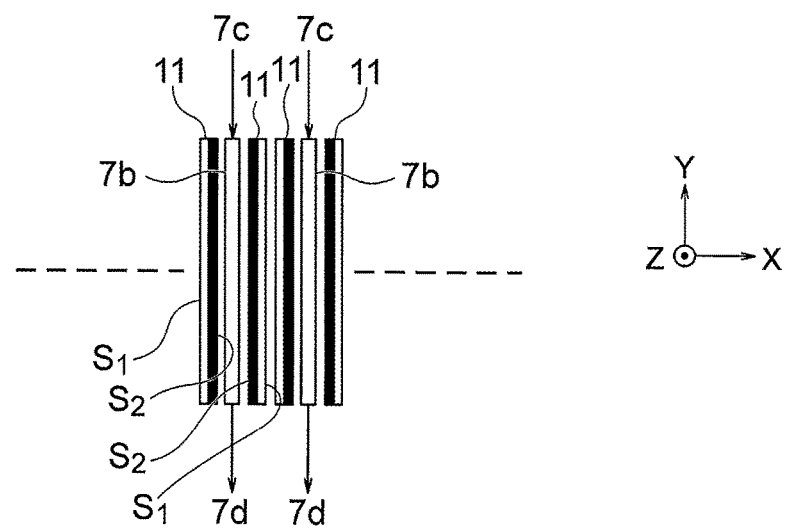

FIGS. 6A and 6B are sectional views illustrating a structure of a substrate treatment apparatus of a second embodiment.

Instead of the coolant gas supplying module 5a and the like, the substrate treatment apparatus of the present embodiment includes a coolant water supplying module 7a, coolant water storing modules 7b, coolant water inlets 7c and coolant water outlets 7d. The coolant water supplying module 7a, the coolant water storing modules 7b, the coolant water inlets 7c and the coolant water outlets 7d are an example of the cooling module.

The coolant water supplying module 7a supplies coolant water to the coolant water storing modules 7b in the chamber 1. The semiconductor wafers 11 are held such that the back surfaces $S_2$ face the coolant water storing modules 7b. The back surfaces $S_2$ of the semiconductor wafers 11 may be or may not be in contact with the coolant water storing modules 7b. The coolant water flows into the coolant water storing modules 7b through the coolant water inlets 7c, and flows out of the coolant water storing modules 7b through the coolant water outlets 7d. The semiconductor wafers 11 of the present embodiment are cooled by the coolant water supplied into the coolant water storing modules 7b.

Supplying timing and a supplying amount of the coolant water are controlled by the controller 6 as similar to the IPA and the silylation agent. For example, the examples of operation in FIGS. 3A to 4C can be applied to the present embodiment by replacing the coolant gas with the coolant water.

As described above, the coolant water in the present embodiment is supplied to the semiconductor wafers 11 to cool the semiconductor wafers 11 while the silylation agent or the IPA in a gas state is supplied to the semiconductor wafers 11. Therefore, according to the present embodiment, it is possible to suppress collapse of patterns 11b on the semiconductor wafers 11 when the patterns 11b on the semiconductor wafers 11 are silylated using a chemical in a gas state.

Third Embodiment

Figure 7A:
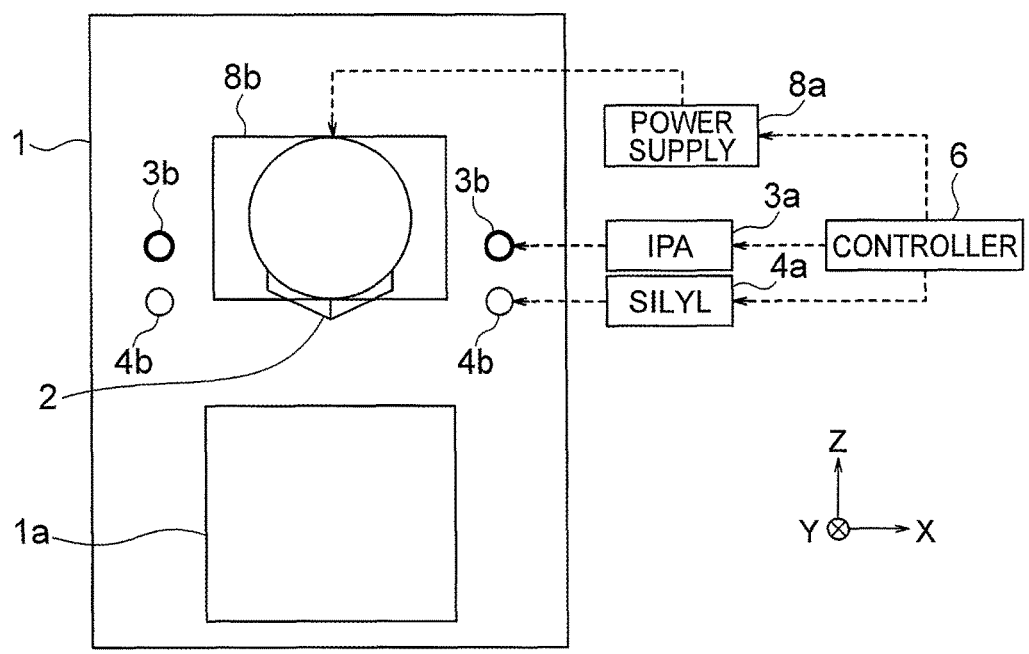
FIGS. 7A and 7B are sectional views illustrating a structure of a substrate treatment apparatus of a third embodiment.
Figure 7B:
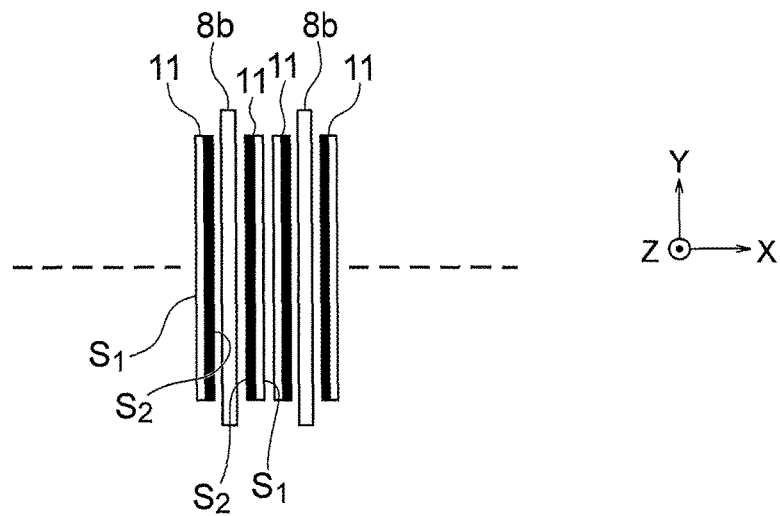

FIGS. 7A and 7B are sectional views illustrating a structure of a substrate treatment apparatus of a third embodiment.

Instead of the coolant gas supplying module 5a and the like, the substrate treatment apparatus of the present embodiment includes a power supply 8a and Peltier devices 8b. The power supply 8a and the Peltier devices 8b are an example of the cooling module.

The power supply 8a can make the Peltier devices 8b exhibit a cooling function thereof by supplying power to the Peltier devices 8b. The semiconductor wafers 11 are held such that back surfaces $S_2$ face the Peltier devices 8b. The back surfaces $S_2$ of the semiconductor wafers 11 may be or may not be in contact with the Peltier devices 8b. The semiconductor wafers 11 of the present embodiment are cooled by the cooling function of the Peltier devices 8b.

Operation timing of the Peltier devices 8b is controlled by a controller 6 as similar to the IPA and a silylation agent. For example, the examples of operation in FIGS. 3A to 4C can be applied to the present embodiment by replacing jet/stop of the coolant gas with on/off of the Peltier devices 8b.

As described above, the semiconductor wafers 11 in the present embodiment are cooled by the Peltier devices 8b while the silylation agent or the IPA in a gas state is supplied to the semiconductor wafers 11. Therefore, according to the present embodiment, it is possible to suppress collapse of patterns 11b on the semiconductor wafers 11 when the patterns 11b on the semiconductor wafers 11 are silylated using a chemical in a gas state.

Fourth Embodiment

Figure 8A:
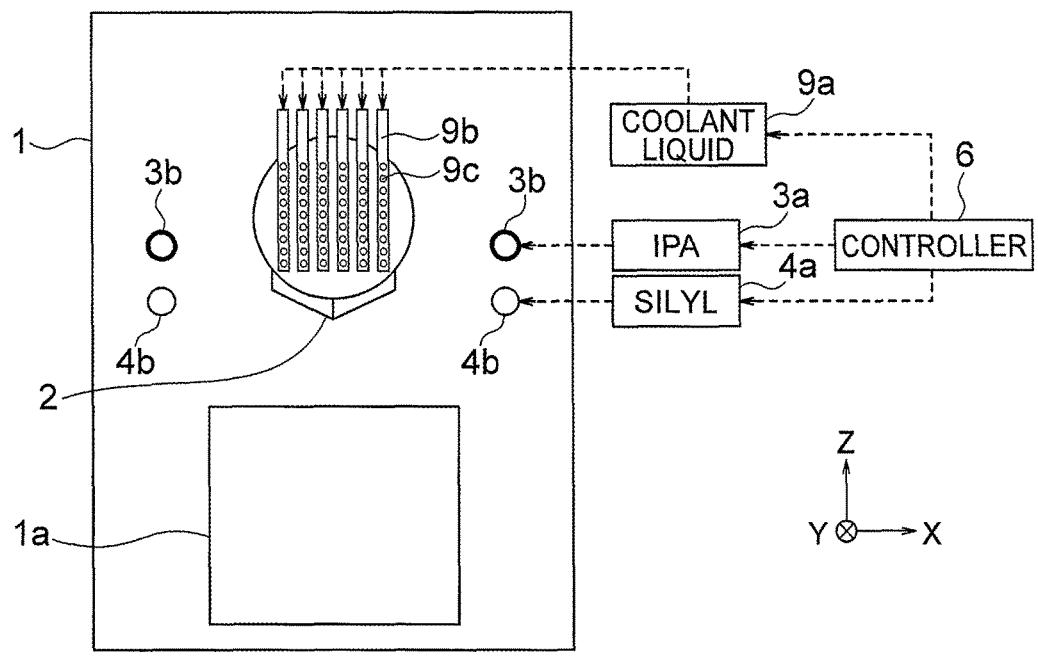
FIGS. 8A and 8B are sectional views illustrating a structure of a substrate treatment apparatus of a fourth embodiment.
Figure 8B:
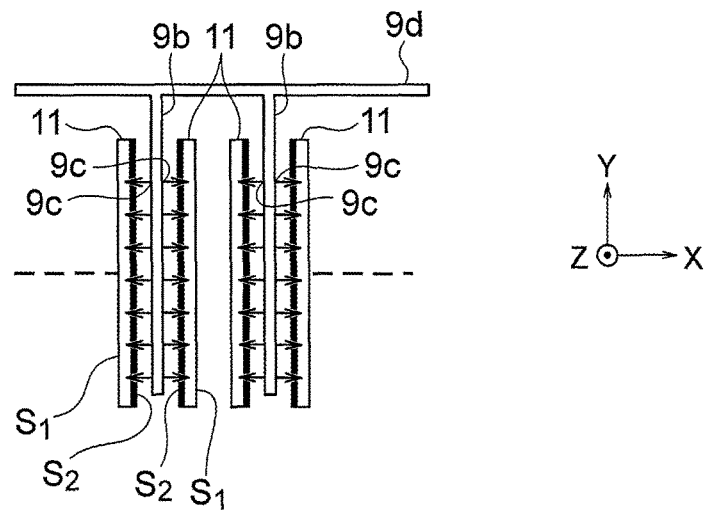

FIGS. 8A and 8B are sectional views illustrating a structure of a substrate treatment apparatus of a fourth embodiment.

Instead of the coolant gas supplying module 5a and the like, the substrate treatment apparatus of the present embodiment includes a coolant liquid supplying module 9a, coolant liquid nozzles 9b, coolant liquid supplying ports 9c and a coolant liquid pipe 9d. The coolant liquid supplying module 9a, the coolant liquid nozzles 9b, the coolant liquid supplying ports 9c and the coolant liquid pipe 9d are an example of the cooling module.

The coolant liquid supplying module 9a supplies a coolant liquid to the semiconductor wafers 11 in the chamber 1. The coolant liquid supplying module 9a jets the coolant liquid to back surfaces $S_2$ of semiconductor wafers 11 from the coolant liquid supplying ports 9c of the coolant liquid nozzles 9b. The semiconductor wafers 11 are thereby cooled. The coolant liquid nozzles 9b branch from the coolant liquid pipe 9d connected to the coolant liquid supplying module 9a. The coolant liquid supplying module 9a supplies the coolant liquid to the coolant liquid nozzles 9b through the coolant liquid pipe 9d. In the present embodiment, the coolant liquid nozzles 9b are disposed between a pair of semiconductor wafers 11. Supplying timing and a supplying amount of the coolant liquid are controlled by the controller 6 as similar to the IPA and the silylation agent.

The coolant liquid of the present embodiment is preferably a volatile liquid. In this case, the coolant liquid is vaporized on the back surfaces $S_2$ of the semiconductor wafers 11. The semiconductor wafers 11 are effectively cooled by vaporization heat of the coolant liquid.

FIG. 9 is a table illustrating examples of the coolant liquid of the fourth embodiment. As illustrated in FIG. 9, the examples of the coolant liquid of the present embodiment are organic liquids such as alcohol, ketone, ether and alkane. The table in FIG. 9 illustrates boiling points of these organic liquids.

FIGS. 10A to 12C are graphs illustrating examples of operation of the substrate treatment apparatus of the fourth embodiment.

In FIGS. 10A to 12C, the IPA is supplied to the semiconductor wafers 11 before the silylation agent is supplied, and the IPA is supplied again to the semiconductor wafers 11 after the silylation agent is supplied, as similar to those of FIGS. 3A to 4C described above. The silylation agent is, for example, TMSDMA or HMDS.

Figure 10A:
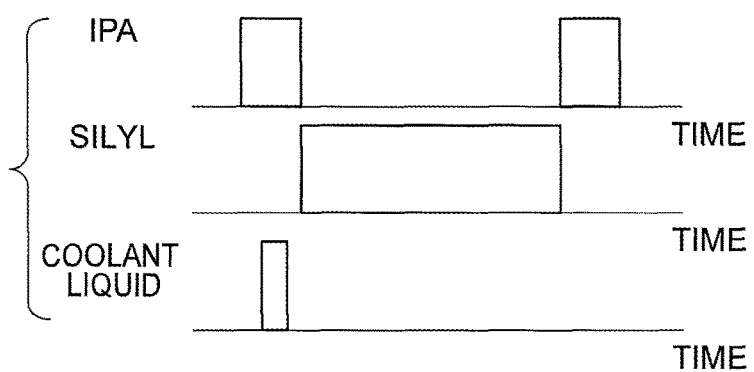

In an example of FIG. 10A, the coolant liquid is supplied (jetted) only once before the silylation agent is supplied. This example has an advantage that the semiconductor wafers 11 can be cooled before the silylation.

Figure 10B:
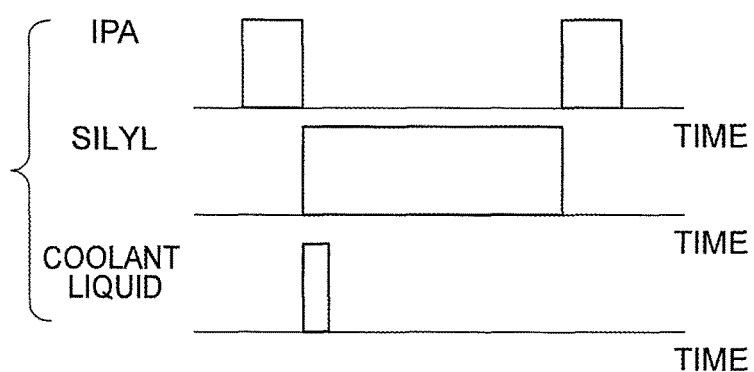

In an example of FIG. 10B, the coolant liquid is supplied only once while the silylation agent is supplied. This supply of the coolant liquid is started at the same time as start of the supply of the silylation agent. This example has an advantage that an amount of using the coolant liquid can be reduced because a period for cooling the semiconductor wafers 11 can be limited only to the period in which the silylation is performed.

Figure 10C:
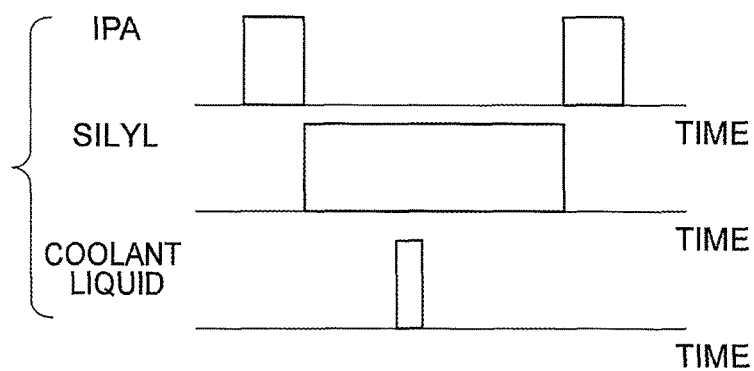

In an example of FIG. 10C, the coolant liquid is supplied only once while the silylation agent is supplied. This supply of the coolant liquid is started after the start of the supply of the silylation agent. This example has an advantage that an amount of using the coolant liquid can be reduced because a period for cooling the semiconductor wafers 11 can be limited only to the period in which the silylation is performed.

In an example of FIG. 11A, the coolant liquid is intermittently supplied plural times before and while the silylation agent is supplied. In an example of FIG. 11B, the coolant liquid is intermittently supplied plural times while the silylation agent is supplied. In an example of FIG. 11C, the coolant liquid is intermittently supplied plural times while and after the silylation agent is supplied. In an example of FIG. 11D, the coolant liquid is intermittently supplied plural times before, while, and after the silylation agent is supplied. According to these examples, a cooling function similar to that of the examples in FIGS. 3A to 3D can be realized.

Figure 12A:
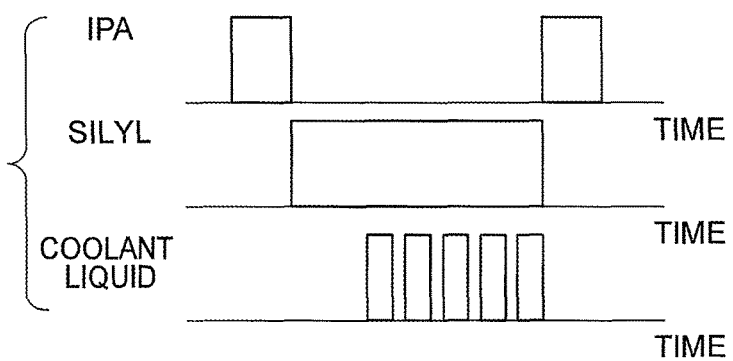
Figure 12B:
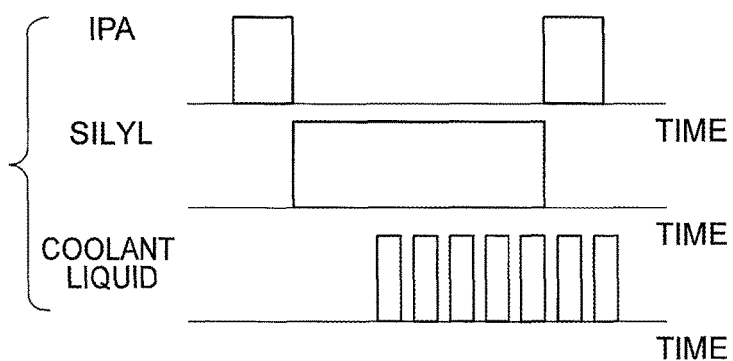
Figure 12C:
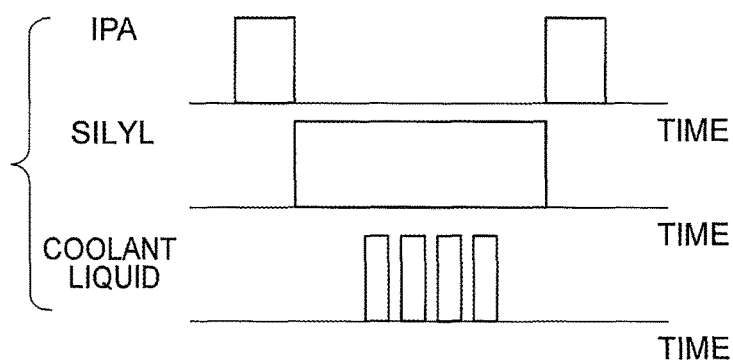

Also in examples of FIGS. 12A to 12C, the coolant liquid is intermittently supplied plural times. According to these examples, a cooling function similar to that of the examples in FIGS. 4A to 4C can be realized.

In the examples of FIGS. 10A to 10C, the coolant liquid is supplied for a short period. In the examples of FIGS. 11A to 12C, the coolant liquid is intermittently supplied. This is because vaporization of the coolant liquid can be accelerated while the supply of the coolant liquid is stopped and the semiconductor wafers 11 can be thereby effectively cooled.

As described above, the coolant liquid in the present embodiment is supplied to the semiconductor wafers 11 to cool the semiconductor wafers 11 while the silylation agent or the IPA in a gas state is supplied to the semiconductor wafers 11. Therefore, according to the present embodiment, it is possible to suppress collapse of patterns 11b on the semiconductor wafers 11 when the patterns 11b on the semiconductor wafers 11 are silylated using a chemical in a gas state.

Fifth Embodiment

Figure 13A:
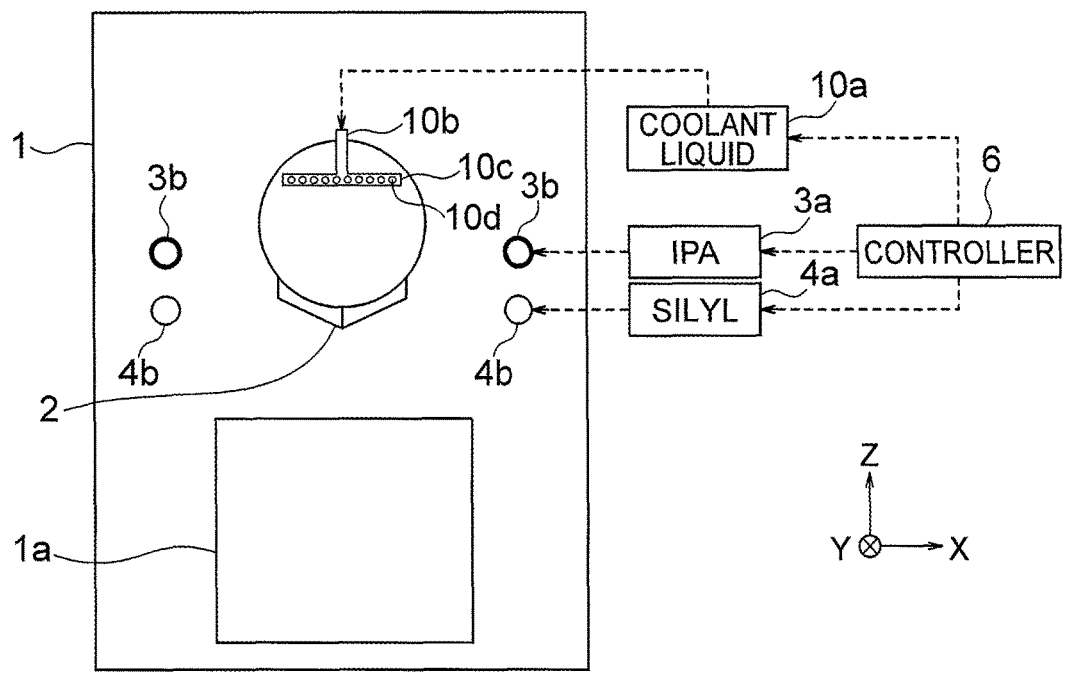
FIGS. 13A and 13B are sectional views illustrating a structure of a substrate treatment apparatus of a fifth embodiment.
Figure 13B:
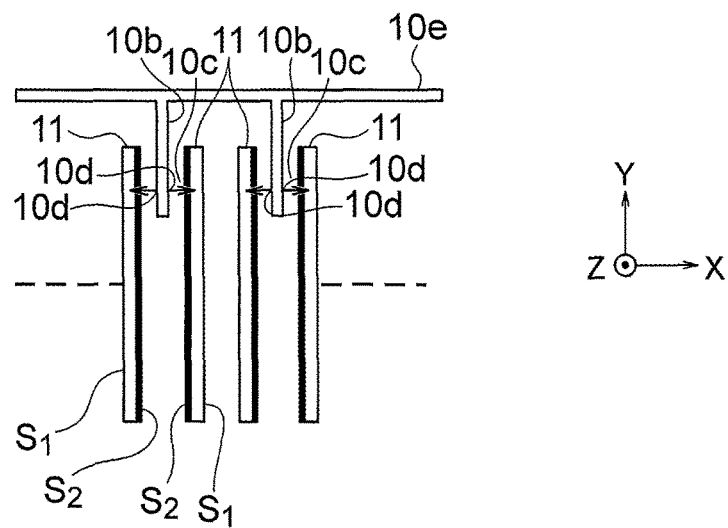

FIGS. 13A and 13B are sectional views illustrating a structure of a substrate treatment apparatus of a fifth embodiment.

Instead of the coolant gas supplying module 5a and the like, the substrate treatment apparatus of the present embodiment includes a coolant liquid supplying module 10a, coolant liquid branch pipes 10b, coolant liquid nozzles 10c, coolant liquid supplying ports 10d and a coolant liquid pipe 10e. The coolant liquid supplying module 10a, the coolant liquid branch pipes 10b, the coolant liquid nozzles 10c, the coolant liquid supplying ports 10d and the coolant liquid pipe 10e are an example of the cooling module.

The coolant liquid supplying module 10a supplies a coolant liquid to semiconductor wafers 11 in the chamber 1. The coolant liquid supplying module 10a jets the coolant liquid to back surfaces $S_2$ of the semiconductor wafers 11 from the coolant liquid supplying ports 10d of the coolant liquid nozzles 10c connected to the coolant liquid branch pipes 10b. The semiconductor wafers 11 are thereby cooled. The coolant liquid branch pipes 10b branches from the coolant liquid pipe 10e connected to the coolant liquid supplying module 10a. The coolant liquid supplying module 10a supplies the coolant liquid to the coolant liquid nozzles 10c through the coolant liquid pipe 10e. In the present embodiment, a coolant liquid nozzle 10c is disposed between a pair of semiconductor wafers 11. Supplying timing and a supplying amount of the coolant liquid are controlled by the controller 6 as similar to the IPA and the silylation agent. For example, the examples of operation in FIGS. 10A to 12C can be applied to the present embodiment.

The coolant liquid of the present embodiment is preferably a volatile liquid as similar to the fourth embodiment. In this case, the coolant liquid is vaporized on the back surfaces $S_2$ of semiconductor wafers 11. The semiconductor wafers 11 are effectively cooled by vaporization heat of the coolant liquid.

As described above, the coolant liquid in the present embodiment is supplied to the semiconductor wafers 11 to cool the semiconductor wafers 11 while the silylation agent or the IPA in a gas state is supplied to the semiconductor wafers 11. Therefore, according to the present embodiment, it is possible to suppress collapse of patterns 11b on the semiconductor wafers 11 when the patterns 11b on the semiconductor wafers 11 are silylated using a chemical in a gas state.

Here, the fourth and fifth embodiments are compared with each other. In the fourth embodiment, each semiconductor wafer 11 can be surely cooled by jetting the coolant liquid to almost the whole of the back surface $S_2$ of each semiconductor wafer 11. On the other hand, the coolant liquid in the fifth embodiment is jetted to a part (upper part) of the back surface $S_2$ of each semiconductor wafer 11. Therefore, the coolant liquid in the fifth embodiment falls down on the back surface $S_2$, and the coolant liquid is thereby supplied to the whole of the back surface $S_2$. Therefore, the fifth embodiment has advantages that an amount of using the coolant liquid can be reduced and that vaporization of the coolant liquid can be accelerated.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A substrate treatment apparatus comprising:
   a housing configured to house a plurality of substrates;
   a chemical supplying module configured to simultaneously supply one or more chemicals in a gas state to the plurality of substrates in the housing, the one or more chemicals including a first chemical that contains a silylation agent;
   a cooling module configured to simultaneously cool the plurality of substrates in the housing; and
   a controller configured to control the chemical supplying module and the cooling module to simultaneously cool the plurality of substrates in the housing by the cooling module while any of the one or more chemicals is simultaneously supplied from the chemical supplying module to the plurality of substrates in the housing.

2. The apparatus of claim 1, wherein the one or more chemicals further include a second chemical that contains alcohol.

3. The apparatus of claim 1, wherein the controller controls the cooling module to simultaneously cool the plurality of substrates such that a temperature of the plurality of substrates is lower than a boiling point of the one or more chemicals.

4. The apparatus of claim 1, wherein
   the one or more chemicals include a chemical having a first boiling point and a chemical having a second boiling point lower than the first boiling point, and the controller controls the chemical supplying module to simultaneously supply the chemical having the first boiling point to the plurality of substrates after simultaneously supplying the chemical having the second boiling point to the plurality of substrates.

5. The apparatus of claim 4, wherein the controller controls the chemical supplying module to simultaneously supply the chemical having the second boiling point to the plurality of substrates again after simultaneously supplying the chemical having the first boiling point to the plurality of substrates.

6. The apparatus of claim 1, wherein the cooling module simultaneously cools the plurality of substrates by simultaneously supplying a gas or a liquid to cool the plurality of substrates.

7. The apparatus of claim 1, wherein the cooling module simultaneously cools the plurality of substrates with at least a Peltier device disposed near the plurality of substrates.

8. The apparatus of claim 1, wherein the controller controls the chemical supplying module and the cooling module such that the cooling module simultaneously cools the plurality of substrates in the whole period in which the first chemical is simultaneously supplied from the chemical supplying module to the plurality of substrates.

9. The apparatus of claim 1, wherein the controller controls the chemical supplying module and the cooling module such that the cooling module simultaneously cools the plurality of substrates in one or more parts of a period in which the first chemical is simultaneously supplied from the chemical supplying module to the plurality of substrates.

* * * * *